US011058017B2

(12) United States Patent
Tessier et al.

(10) Patent No.: US 11,058,017 B2
(45) Date of Patent: Jul. 6, 2021

(54) VIDEO CONVERTER WITH INTEGRATED POWER SUPPLY

(71) Applicant: Theatrixx Technologies Inc., Montreal (CA)

(72) Inventors: Jacques Tessier, Saint-Bruno-de-Montarville (CA); Gabriel Duschinsky, Saint-Bruno-de-Montarville (CA); Bing Xiao Liu, Montreal (CA); Jean-Francois Pepin, Montreal (CA); Maxence Lenoir, Montreal (CA); Alexandra D. Tessier, Montreal (CA); Noe Saint-Onge, Montreal (CA)

(73) Assignee: THEATRIXX TECHNOLOGIES INC., Montreal (CA)

(*) Notice: Subject to any disclaimer, the term of this patent is extended or adjusted under 35 U.S.C. 154(b) by 162 days.

Patent file contains an affidavit/declaration under 37 CFR 1.130(b).

(21) Appl. No.: 16/307,868

(22) PCT Filed: Oct. 28, 2016

(86) PCT No.: PCT/CA2016/051253
§ 371 (c)(1),
(2) Date: Dec. 6, 2018

(87) PCT Pub. No.: WO2017/210769
PCT Pub. Date: Dec. 14, 2017

(65) Prior Publication Data
US 2019/0307002 A1 Oct. 3, 2019

Related U.S. Application Data

(60) Provisional application No. 62/346,297, filed on Jun. 6, 2016.

(51) Int. Cl.
*H05K 5/02* (2006.01)
*G06F 1/16* (2006.01)
(Continued)

(52) U.S. Cl.
CPC ............. *H05K 5/0217* (2013.01); *G06F 1/16* (2013.01); *H04N 5/44* (2013.01); *H04N 5/64* (2013.01); *H04N 7/01* (2013.01); *H05K 5/0065* (2013.01)

(58) Field of Classification Search
CPC ... G06F 1/16; H04N 7/01; H04N 5/44; H04N 5/64; G09G 2370/12; H05K 5/0065; H05K 5/0217
See application file for complete search history.

(56) References Cited

U.S. PATENT DOCUMENTS

D677,280 S * 3/2013 Petty ............................ D14/496
D708,642 S 7/2014 Petty et al.
(Continued)

OTHER PUBLICATIONS

"Convertisseurs video", Theatrixx Technologies, May 7, 2016, https://web.archive.org/web/20160507151436/http://www.theatrixx.com/fr/product/VIDEO-CONVERTERS/ (Year: 2016).*
(Continued)

*Primary Examiner* — James Wu
(74) *Attorney, Agent, or Firm* — Brouillette Legal Inc.; Robert Brouillette

(57) ABSTRACT

A professional video converter is a video signal processing device built for audio-video applications to convert from one video format to another. It includes a heavy-duty enclosure, an electronic circuit to convert/distribute/scale/buffer/amplify video and/or audio and an internal power supply unit. The power supply comes from a mains-level electrical input connector. An additional electrical output connector may be added to power extra equipment. The unit can be installed and suspended safely, thanks to a built-in rigging thread and
(Continued)

attachment points on its enclosure. The unit may be placed securely on any surface using the rubber pad, and magnets allow clean stacking of multiple devices. The connectors are also protected by the specific shape of the enclosure of the converter.

20 Claims, 8 Drawing Sheets

(51) Int. Cl.
  *H04N 5/44* (2011.01)
  *H04N 5/64* (2006.01)
  *H04N 7/01* (2006.01)
  *H05K 5/00* (2006.01)

(56) References Cited

U.S. PATENT DOCUMENTS

| | | |
|---|---|---|
| 2006/0277589 A1 | 12/2006 | Margis et al. |
| 2013/0265384 A1 | 10/2013 | Shoemake et al. |
| 2014/0253673 A1 | 9/2014 | Barredo |
| 2014/0310442 A1 | 10/2014 | Kimura et al. |
| 2016/0050375 A1* | 2/2016 | Soffer .................. H04N 5/268 348/445 |

OTHER PUBLICATIONS

Anonymous: "Convertisseurs video; Theatrixx Technologies", May 7, 2012 (May 7, 2016), XP055655714, retrieved from the Internet: URL:https://web.archive.org/web/20160507151436/http://www.theatrixx.com/fr/productVIDE0-CONVERTERS/ [retrieved on Feb. 20, 2020] * the whole document *.

514: "xVision Video Converter HDMI to SDI"; Jan. 8, 2020 (Jan. 8, 2020), p. 3077, XP055655873; retrieved from the Internet: URL:https://www.markertek.com/Attachments/Specifications/Theatrixx/TTX/XVV-HDMI2SDI_Specs.pdf, [retrieved on Feb. 20, 2020] * the whole document *.

Anonymous: "Amazon.com: Theatrixx XVV-HDMI2SDI: xVision 1080p 720p HDMI to SDI Tour Ready Video Converter: Home Audio & Theater", Jan. 8, 2020 (Jan. 8, 2020)m XP055655881, retrieved from the Internet: URL:https:/amazon.com/Theatrixx-XVV-H DMI2SDI-xVision-1080p-Converter/dp/B01DE0E83C [retrieved on Feb. 20, 2020] * the whole document *.

International Search Report dated Jan. 11, 2017, from the corresponding patent application PCT/CA2016/051253.

European Search Report dated Jan. 24, 2020, from the corresponding patent application EP 16904258.7.

* cited by examiner

VIDEO CONVERTER WITH INTEGRATED POWER SUPPLY

CROSS-REFERENCE TO RELATED APPLICATION

The present patent application claims the benefits of priority of commonly assigned U.S. Patent Application No. 62/346,297, entitled "Video converter with Integrated power supply" and filed at the U.S.P.T.O. on Jun. 6, 2016.

FIELD OF THE INVENTION

The present invention generally relates to the field of audio-video equipment but more particularly to digital video converters. More specifically, the invention relates to a high quality and reliable converter box.

BACKGROUND OF THE INVENTION

Video converters have been used for many years in almost every live event, broadcast, AV installation and world tour featuring video content. There is no universal standard for video transmission so video converters are almost always required to match signals coming from different devices together, transmit images over long distances, distribute signal, etc. There are many video converters readily available on the market but none are designed to be used in a harsh and intensive environment like the entertainment industry or critical application. They are often the weakest point in the signal chain because of this.

A prior art video converter is designed around its printed circuit board and will offer minimal focus on the actual usage application. The circuit will be enclosed in a low priced metal box offering no protection against eventual drops, damaged connectors, etc. Furthermore, no consideration has been given for hanging, installing or rigging the units safely.

The AC adapters ("wall warts") are external in a prior art video converter and every manufacturer uses a different DC plug and voltage range. This allows the manufacturer to avoid electrical certification in order to reduce price, but at the cost of reliability, since wall-warts usually contain a lower quality Power Supply Unit (PSU). There is no such thing as a professional wall-wart. Wall warts have different shapes and size and multiple wall warts do not fit on a power bar. Power plug on prior art video converters are mostly non-lockable and a big event with expensive video equipment can be interrupted if a person hits the cluster of wall warts or walks on the cord.

Video converters are always used with other video equipment, like a source or a monitor. So the use of a power bar to distribute power is mandatory. This new part has to be attached somewhere, with tape or zip-ties for example, which is rather amateur compared to the price of the equipment connected to such converters. For instance, such converters may be found at the rear of a television in a corporate event.

Prior art video converters are designed to be as small as possible. The result is a lightweight product with a small footprint, which can fall easily from the surface if not held in place with tape. Furthermore, it is not possible to stack multiple converters together without tape, zip ties or other temporary, messy and unreliable attachment means.

Mounting options are non-existent on prior art video converters. Manufacturers may provide small mounting threads for shelving or key slot. They suggest using custom flimsy metal adapters, or tape.

Most connectors used in typical converters such as HDMI™ and audio connectors are of a non-locking type which can create a reliability problem that can potentially shut down the entire video system.

Prior art video converters have multiple settings available which can be set by small dip switches. Since they are so small the configuration of the unit is cumbersome and error prone.

Prior art video converters do not always offer an easy way to determine the unit's status. There is often a single LED or no indicator at all to confirm signal presence, validity, strength, etc.

Prior art video converters often share the same form factor even for totally different functions making them hard to quickly identify the right unit when in the field. This can becomes a serious problem when working with untrained staff, which may not be familiar with the subtle differences in models numbers.

There is thus a need for a novel video converter that outcome all the drawbacks of prior art converters. The present invention aims at providing such converter and will be described herein below.

Other and further objects and advantages of the present invention will be obvious upon an understanding of the illustrative embodiments about to be described or will be indicated in the appended claims, and various advantages not referred to herein will occur to one skilled in the art upon employment of the invention in practice.

SUMMARY OF THE INVENTION

The disclosed professional video converter is a radically different invention which overcomes all the problems mentioned above. The present invention is a composition of multiple solutions to exceed the requirements of the industry. Those needs have never been fulfilled by a single unit before.

The invention is directed to a video converter comprising:
- at least one enclosure for protecting electronic components disposed within said enclosure, the electronic components allowing converting at least one input signal each having a first format to at least one output signal each having a second format different from the first format;
- at least input connectors extending from the enclosure, each input connector being adapted for receiving the at least one input signal and transmitting the at least one input signal to the electronic components;
- at least one output connectors extending from said enclosure, each output connector being adapted for transmitting the output signal from the electronic components; and
- an internal power supply comprising an AC to DC conversion unit integrated into the enclosure for powering the electronic components, the conversion unit being configured to be directly connected to a standard AC circuit.

Advantageously, the professional video converter with an internal power supply with AC adapter according to the present invention makes much easier the video connections, in particular on a live presentation, a movie shoot, an event or TV set.

According to a preferred embodiment, the enclosure may comprise a top and a bottom plate and a side wall extending therebetween. The top and bottom plates each define a first foot print and the side wall defines a second foot print smaller than the first foot print. Some of the one or more input and output connectors may therefore be disposed in a niche formed by a portion of the first foot print that overlaps the second foot print. In such a case, the connectors are thus protected by the top and bottom plates.

The shape of the video convertor in accordance with this preferred embodiment makes the connections highly secured by protecting the connectors using the shape of the enclosure itself without limiting the access to the connectors.

In a preferred embodiment, the converter may further comprise an electrical outlet, such as a 120V outlet, adapted for powering a nearby device, such as a projector, a TV, laptop, monitor, audio systems or the like.

The converter is preferably adapted to convert a first video and audio format to a second video and audio format. Such formats may be analog, digital or optical. More specifically, HDMI™, SD-SDI, HD-SDI, 3G-SDI, HD-BaseT™, DVI, DisplayPort™, Analog video, Analog audio, or any other video or audio format.

Other and further objects and advantages of the present invention will be obvious upon an understanding of the illustrative embodiments about to be described or will be indicated in the appended claims, and various advantages not referred to herein will occur to one skilled in the art upon employment of the invention in practice.

BRIEF DESCRIPTION OF THE DRAWINGS

The above and other objects, features and advantages of the invention will become more readily apparent from the following description, reference being made to the accompanying drawings in which:

FIG. 8 shows two stacked video converters in accordance with a preferred embodiment.

DETAILED DESCRIPTION OF THE PREFERRED EMBODIMENT

Figure 1:
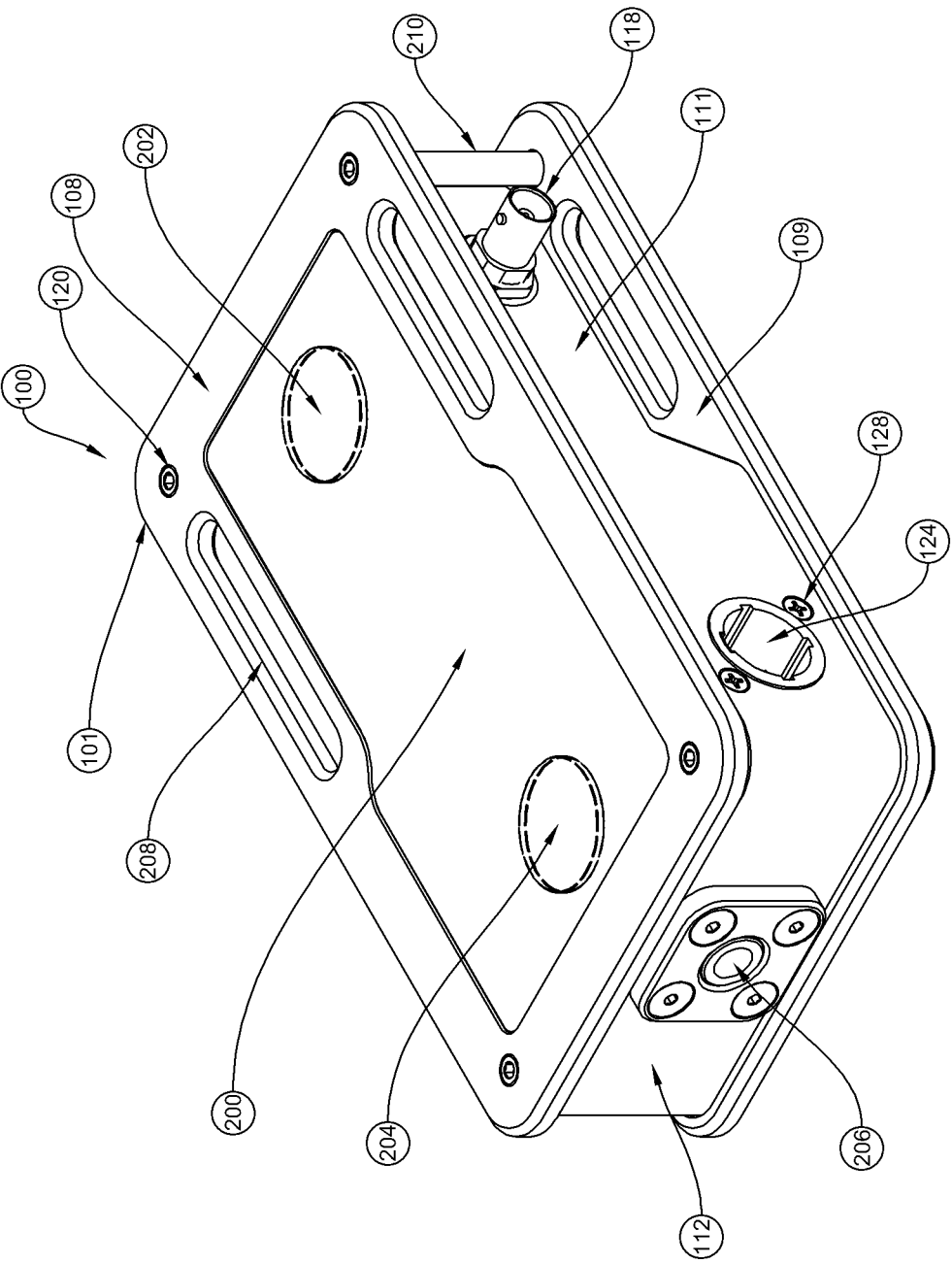
FIG. 1 is a top perspective view of the video converter in accordance with one preferred embodiment of the invention.

A novel video converter will be described hereinafter. Although the invention is described in terms of specific illustrative embodiment(s), it is to be understood that the embodiment(s) described herein are by way of example only and that the scope of the invention is not intended to be limited thereby.

As aforesaid, the present invention is a video converter comprising:

at least one enclosure for protecting electronic components disposed within said enclosure, the electronic components allowing converting at least one input signal each having a first format to at least one output signal each having a second format different from the first format;

at least one input connector extending from the enclosure, each input connector being adapted for receiving the at least one input signal and transmitting the at least one input signal to the electronic components;

at least one output connectors extending from said enclosure, each output connector being adapted for transmitting the output signal from the electronic components; and an internal power supply comprising an AC to DC conversion unit integrated into the enclosure for powering the electronic components, the conversion unit being configured to be directly connected to a standard AC circuit.

According to a preferred embodiment, the enclosure comprises a top and bottom plate and a side wall extending therebetween, the top and bottom plates each define a first foot print and the side wall defines a second foot print smaller than the first foot print; some of the one or more input and output connectors are disposed in a niche formed by a portion of the first foot print that overlaps the second foot print, the connectors are thus protected within the niche by the top and bottom plates.

According to a preferred embodiment, the top and bottom plates defines respectively a first and second aperture aligned one to the other and adjacent to the niche, the apertures being configured to accommodate a safety element to strap and secure the converter any structure.

According to a preferred embodiment, the converter further comprises a stand-off connecting the top and bottom plate at a corner of the convector adjacent to the niche, the stand-off in collaboration with the niche allowing attaching an anti-theft cable, a safety cable and/or a mounting strap.

According to a preferred embodiment, each of the top and bottom plate comprises at least one magnet for temporally fixing the converter on a magnified surface or to stack the converter to a second converter. Preferably each plate comprises two spaced apart magnets.

According to a preferred embodiment, the top plate has a surface defining a groove and the bottom surface has a surface defining a protrusion matching the groove, or the bottom plate has a surface defining a groove and the top surface has a surface defining a protrusion matching the groove, the matching grove and protrusion allowing maintaining a stability of several video converters when stacked together. Preferably, the protrusion has a thickness larger than a depth of the groove for avoiding two consecutive stacked converters to rub one to the other. Also, the protrusion may be a rubber pad or a foam pad acting as a non-skid cushion firmly securing the converter on a flat surface, limiting as such the converter from sliding off.

According to a preferred embodiment, the enclosure forms a squared box or rectangular parallelepiped box allowing setting the converter in different stable positions.

According to a preferred embodiment, the top and bottom plates are made of a metal and/or a shock resistant material, such as but not limited to aluminum.

According to a preferred embodiment, the converter has a weight of at least about 1 kg for ensuring a better stability of the converter or enclosure once installed on a flat surface for using. The recommended weight also prevents the unit from being displaced due to stiffness of a connected cable.

According to a preferred embodiment, the power supply comprises a locking AC connector embedded within the sidewall.

According to a preferred embodiment, the converter further comprises an electrical outlet embedded within the enclosure and adapted for powering another device, such as, but not limited to, a projector, a TV set, a laptop, a monitor, a mobile device or an audio system.

According to a preferred embodiment, the converter is adapted to convert at least one video and/or at least one audio format to, respectively, any other video and/or audio format, such as, but not limited to analog, digital, optical, HDMI™, SD-SDI, HD-SDI, 3G-SDI, HD-BaseT™, DVI, DisplayPort™, analog video and/or analog audio.

According to a preferred embodiment, the connectors are fixedly attached to the enclosure using at least one bolt, nut, mounting thread, plate system and/or screw.

According to a preferred embodiment, the connectors are of a lockable type, the side wall of the enclosure comprising a plurality of holes, each hole being configured to lock one of said lockable connectors. Preferably, the holes comprise a threaded portion to lock the connector. The locked connector may be a High-Definition Multimedia Interface or HDMI™ connector, a S-Video connector, Video Graphic Array or VGA connector, Digital Visual Interface or DVI Connector, an RJ-45 type connector, an optical fiber connector and/or a Serial Digital Interface or SDI connectors.

According to a preferred embodiment, the converter further comprises a plurality of attachment member to attach the converter to a support.

According to a preferred embodiment, the converter further comprises of an internal AC to DC conversion unit to directly operatively connect the converter to a standard AC circuit.

According to a preferred embodiment, the at least one incoming signal format is detected automatically by the convector.

According to a preferred embodiment, the converter further comprises at least one visual indicator for providing at least one status indication of at least one parameter.

According to a preferred embodiment, the converter further comprises a coding system adapted from any of a color and/or alpha numeric character standard providing quick identification of each converter and/or a group of several converters.

Although the invention is mainly directed to a video converter, the same principles of the invention can be applied to an audio converter, or any electronic signal processing unit known in the art.

EXAMPLES

By "about", it is meant that the value of weight can vary within a certain range depending on the margin of error of the method or device used to evaluate such weight. A margin of error of 10% is generally accepted.

Figure 2:
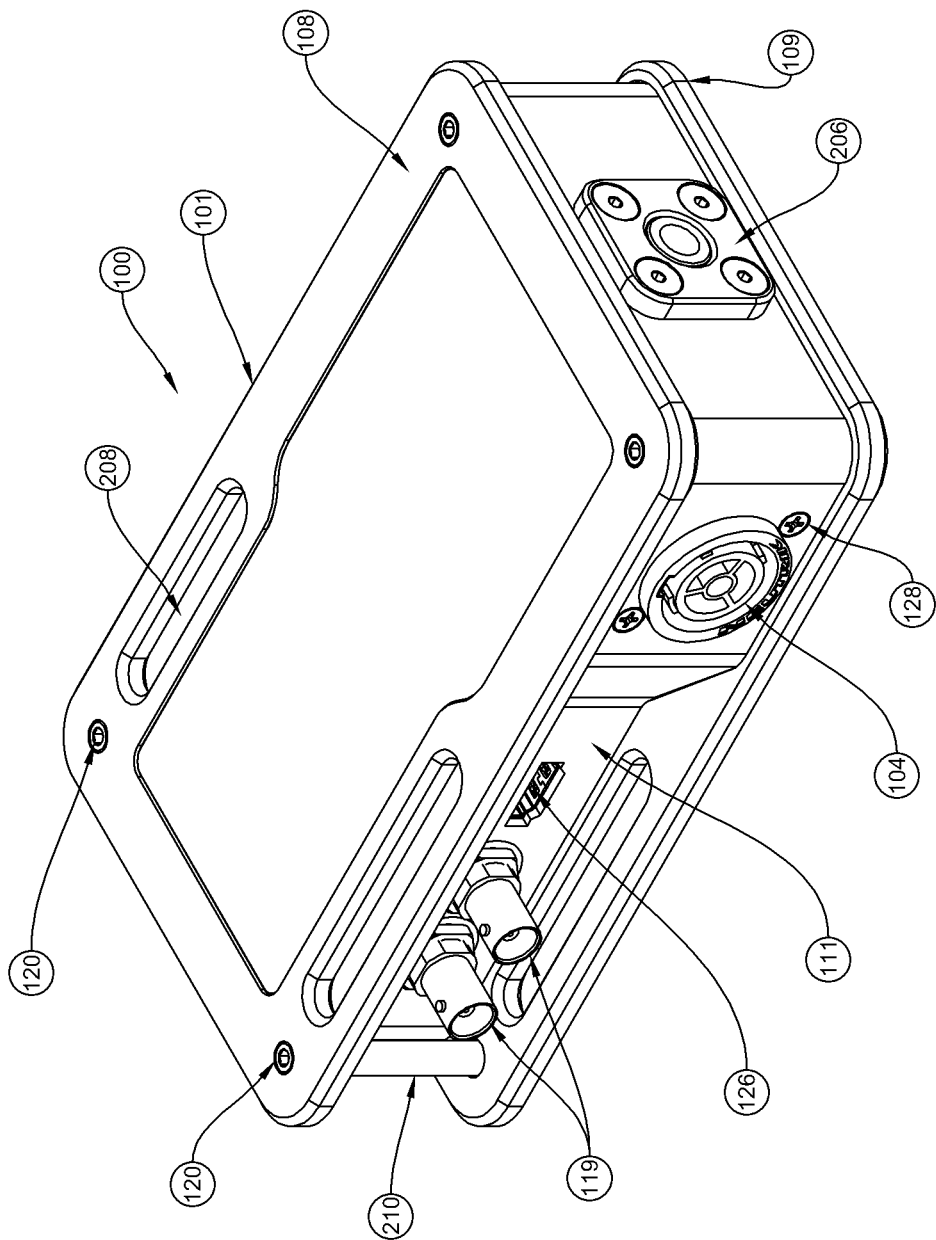
FIG. 2 is another top perspective view of the video converter of FIG. 1.
Figure 3:
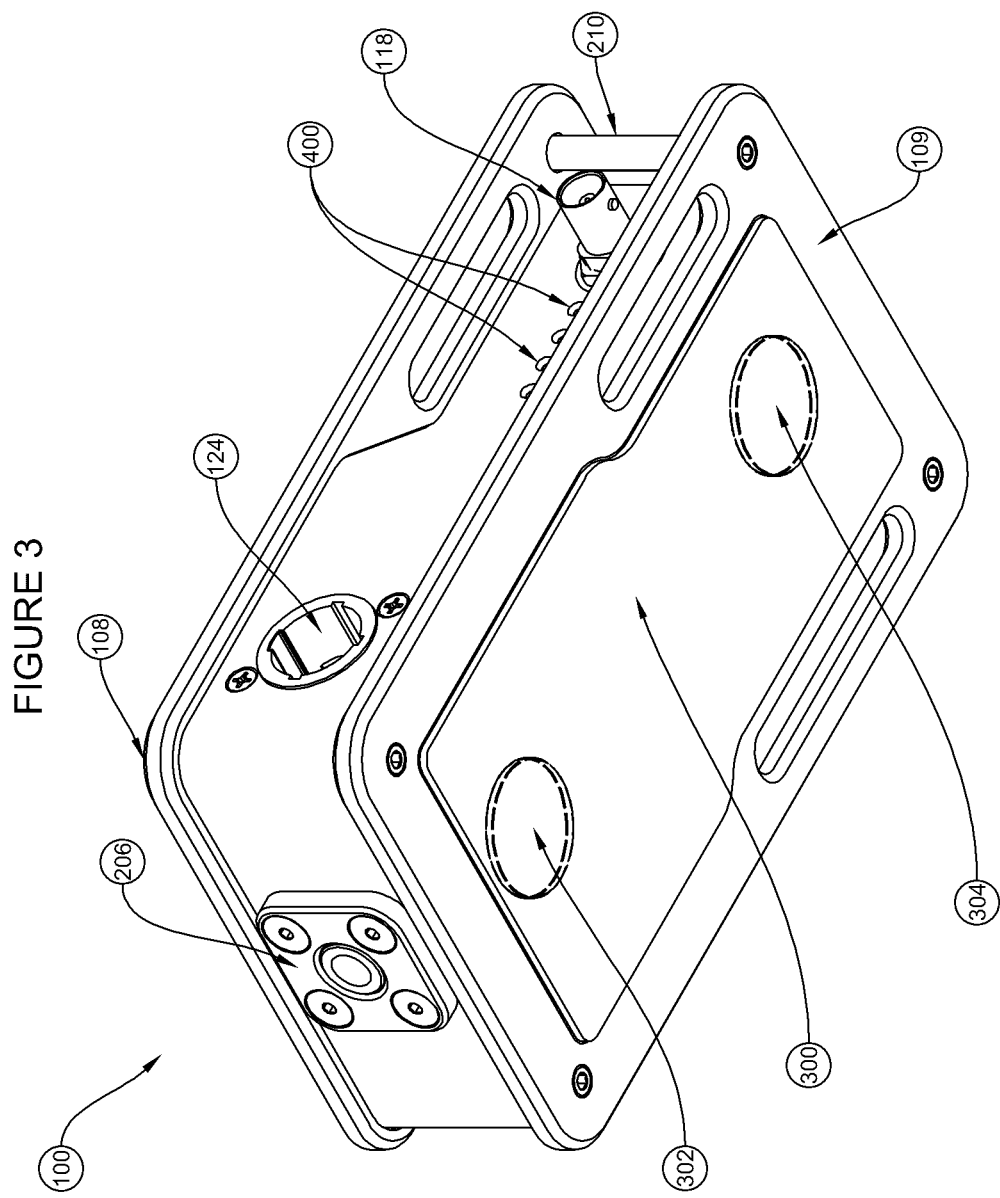
FIG. 3 is a bottom perspective view of the video converter of FIG. 1.
Figure 4:
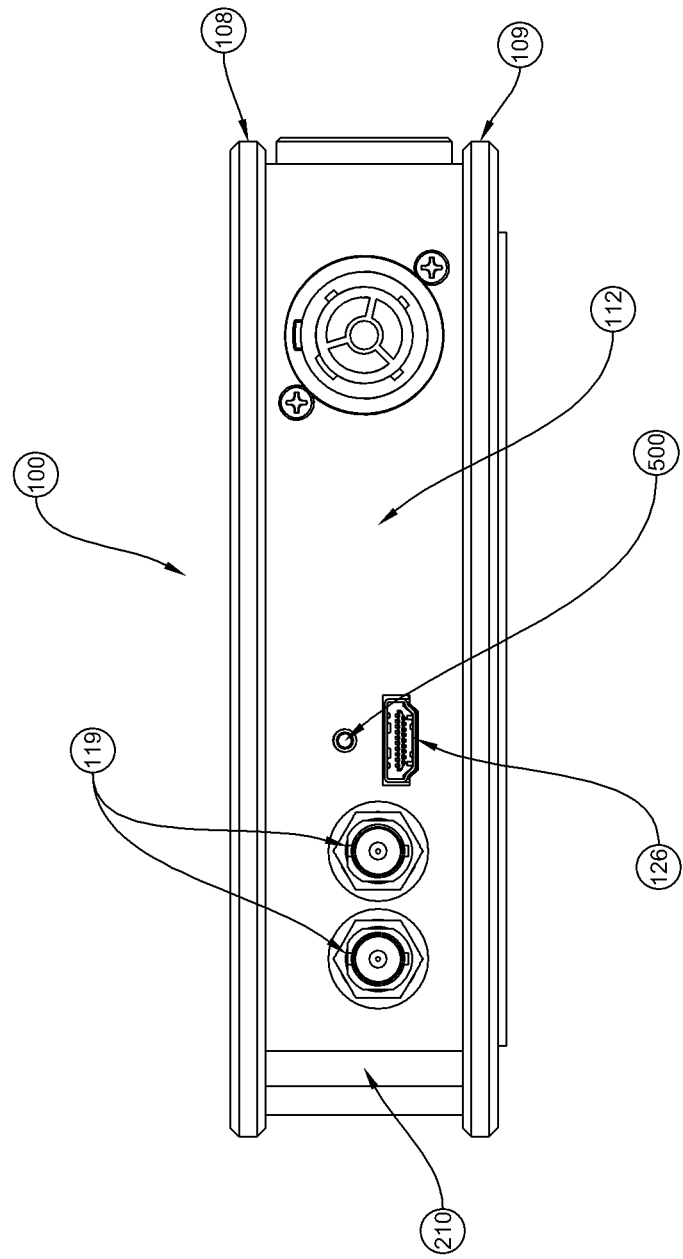
FIG. 4 is a left side view of the video converter of FIG. 1.
Figure 5:
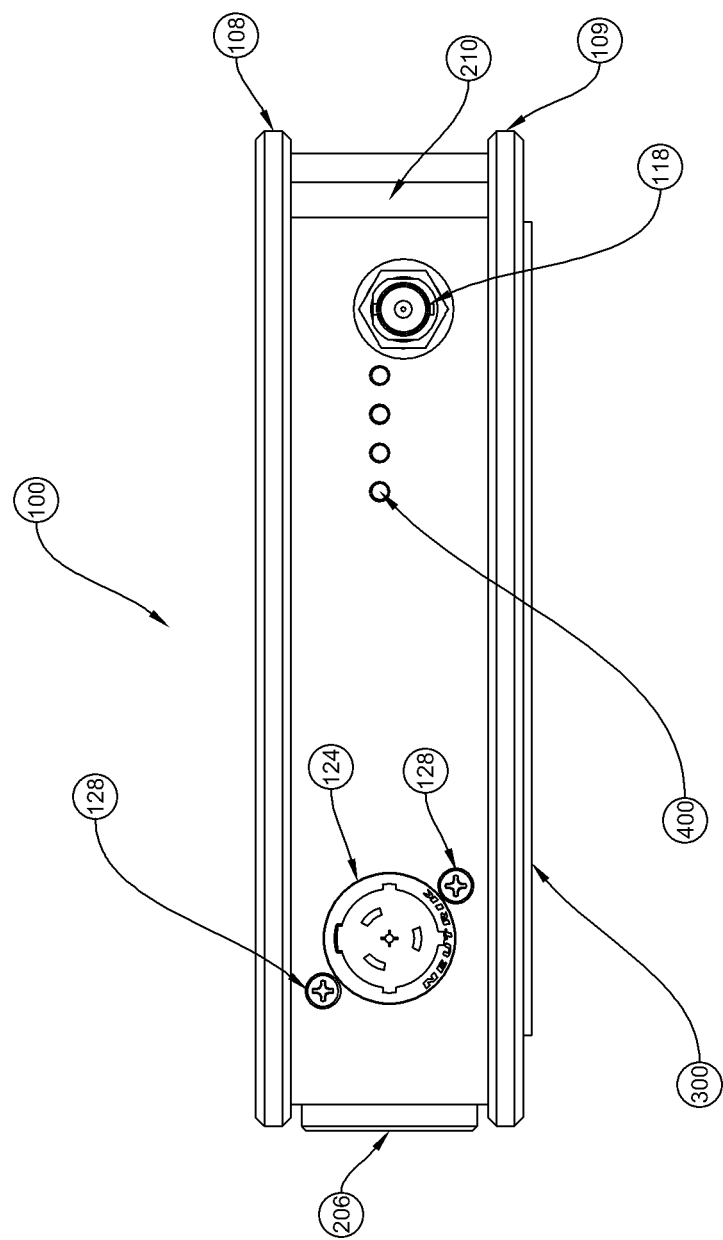
FIG. 5 is right view of the video converter of FIG. 1.

Referring to FIGS. 1 and 2, the video converter 100 comprises an enclosure 101 having a top plate 108, a bottom plate 109 and a side wall 112 connecting the top and bottom plates. The parts of the enclosure are preferably made of machined and/or bended materials disposed between the plates 108 and 109 for connecting the plates forming as such the enclosure or box.

Figure 6:
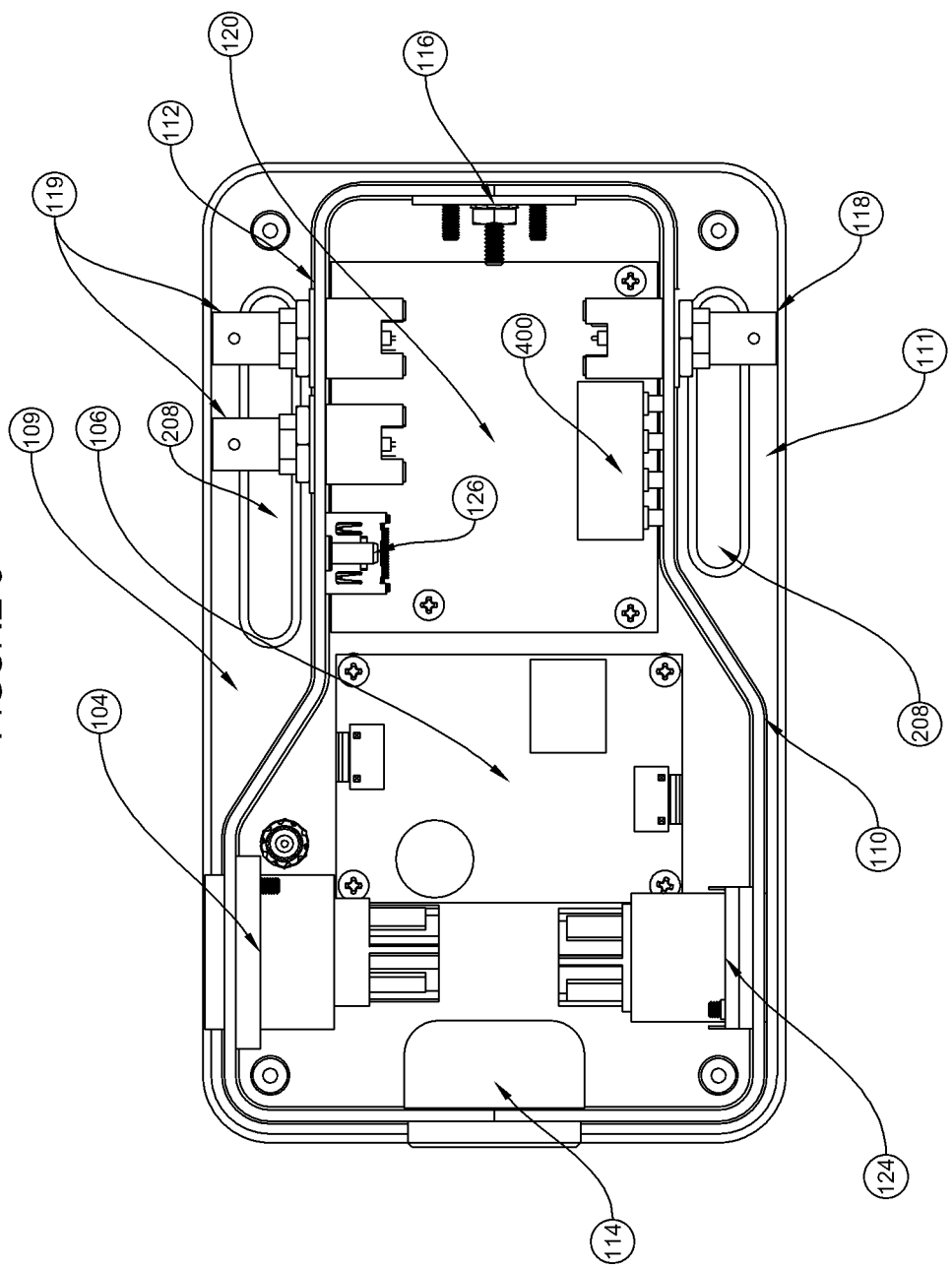
FIG. 6 is an open top view showing the interior electronic components of the video converter in accordance with one preferred embodiment of the invention.

As better seen on FIG. 6, the side wall can be made of two side walls 110 and 112 connected together using connecting means such as a plate 116 and screws 128. Understandably, the side walls may be welded together or connected using a snap on system or other systems known in the art without departing from the scope of the invention.

The plates 108 and 109 are preferably connected together using stand-offs 210, but any other means know in the art may be used.

Figure 7:
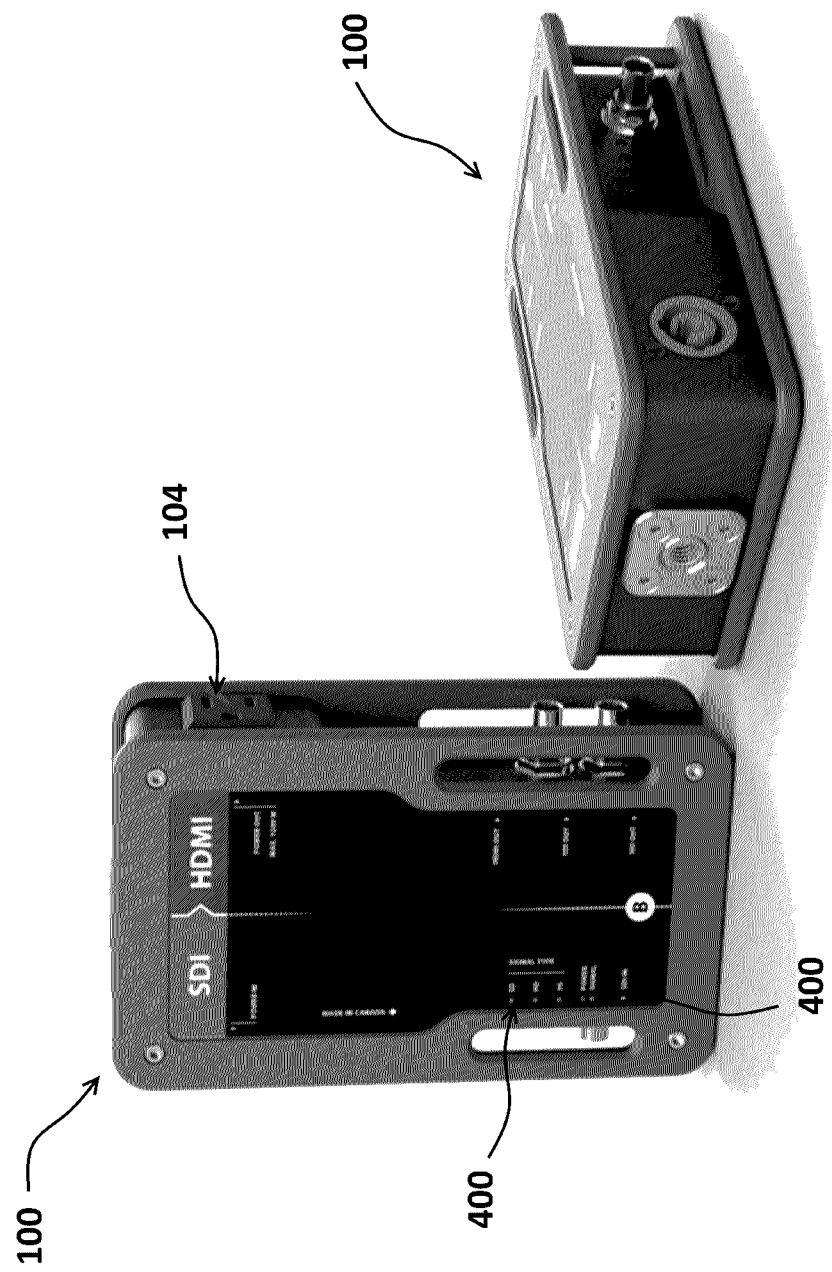
FIG. 7 is a picture of two video converters in accordance with a preferred embodiment of the invention.

As shown in FIG. 7, the form of the converter 100 allows setting the converter in different stable positions. Preferably, the material to be used for the making of the enclosure is metallic material, such as but not limited to, aluminum. The top and bottom plates are preferably made of a metallic material, such as aluminum. The total weight of the converter can be about 1 kg. This heavy weight for a small sized box ensures a better stability of the converter or enclosure once installed for using.

The side wall 112 comprises several apertures to insert and fixed the connectors 104, 118, 119, 124, and 126 (HDMI). The connectors are preferably screwed to the side wall 112 to provide a secure and solid assembly. Some connectors may use a bolt and nut, or a mounting thread and plate system while other connectors may use screws 128 for being fixedly attached to the walls 110 and 112. Understandably, any other means to attach a connector may be used without departing from the scope of the present invention.

Referring more specifically to FIGS. 1-3 and 6, the plates 108 and 109 define a first foot print and the side walls 110 and 112 define a second foot print. The second foot print is smaller than the first foot print forming as such one or two niches 111 on each side of the enclosure, such that the connectors extend from the sidewall into the niche(s) where both foot prints do not overlap.

Outside the portions of the enclosure defined by the niche(s), the plates 108 and 109 extend slightly beyond the second footprint defined by the sidewall 112, providing as such a protection to every connector extending from the sidewalls outside the niche portions, such as for instance the AC connector 124 on FIG. 1. The plates 108 and 109, which are preferably made of a shock resistant and sturdy material, then protect the connectors in case of a drop or other incident.

In another embodiment, the connectors may be recessed inside the side wall 112 to achieve a similar purpose. In such a case the difference in foot prints would not be required.

Still according to a preferred embodiment, the novel converter incorporates many features specifically designed for professional audio-video applications. These features are disclosed herein after.

Safety in Installation:

Referring to FIG. 1, the converter preferably comprises a plurality of attachment members to secure the invention to a structure for both temporary and permanent installation. Such attachment members may comprise, but are not limited to apertures 208 disposed in the top and bottom plates 108 and 109 or/and standard mounting thread 206, which may be of a metric or imperial size. The mounting thread 206 allows the user to attach a standard C-Clamp used in the live-event industry or other type of mounting accessories known in the art. The mounting thread preferably has an interior counterpart 114 adapted to receive the C-Clamp.

The slotted holes 208 on plates 108 and 109 and adjacent to the niches 111, are preferably adapted to accommodate safety straps, safety cables, ropes or other known security elements configured to secure the converter on a substantially flat surface, or any other type of surface.

In a preferred embodiment, all connectors of the converter are of a lockable type. Accordingly, the connections are safe and secure as they are preferably locked to the converter. Such lockable connecters may be of any kind known by the person of the art, such as but not limited to S-Video, VGA, DVI, SDI and the likes.

The converter preferably comprises one or more HDMI™ connector 126. To this day, there is no standard lockable type of HDMI™ connectors. For that purpose, a threaded hole 500 above the HDMI™ connector is adapted to lock the HDMI™ cable to the converter. A specifically made HDMI™ cable is preferably used for that purpose, but it is also possible to use a bracket using a standard HDMI™ cable. For example, the bracket may be disposed around the cable and preferably comprises an aperture adapted to receive a screw or bolt to be inserted in the threaded hole 500.

The external stand-off 210 preferably allows the use of an anti-theft cable, a safety cable or any external attachment device such as a safety strap.

Built-in A.C. Power Supply

Referring in particular to FIG. 6, the professional video converter 100 preferably has an internal AC to DC conversion unit 106 to supply the printed circuit board 120. The professional video converter can directly be connected to a standard AC circuit. The power input connector 102 is preferably a locking type connector like powerCON™ or powerCON TRUE1™ connector from Neutrik™. It is a standard lockable connector used in the live event and AV industries. Understandably, any connector known in the art may be used without departing from the scope of the present invention.

The converter also preferably comprises an AC convenience outlet 104 provided on the side walls 110 and/or 112 to supply power to nearby equipment. Such equipment includes but not limited to laptops, TV monitors, projectors, audio systems or the likes to which the converter is providing a converted video or audio signal. The equipment may also comprise an assembly of TV monitors, projectors, audio systems and/or the likes combined with their support fixture. Accordingly, having a built-in power supply requires the converter to be certified for electrical safety.

Stackability

It is not uncommon to see more than a dozen prior art converters used simultaneously in a typical audio-video control center. The present invention provides a clean and stable ways of stacking multiple converters together.

For that purpose, high-power magnets 202-204 and 302-304 are preferably used (See FIGS. 1 and 2). Such magnet may be disposed on both top and/or bottom plates 108 and 109. Accordingly, the bottom plate 109 of a first converter is in contact with the top plate 108 of a second converter.

A matching groove 200 on the top plate 108 of the converter and a protruding rubber or foam pad 300 may be installed on the bottom plate 109 allow maintaining the stability of several professional video converters when stacked or placed on a substantially flat surface without requiring tape. As shown on FIG. 8, the protruding rubber pad 300 combined with the matching groove 200 on the top plate 108 of the converter ensure a precise, aligned and secured mating between two converters 100.

The thickness of the rubber pad ensures that the top and bottom plates 108 and 109 of two converters cannot be rubbed together and damage the exterior finish. The rubber pad also acts as a non-skid cushion firmly securing the unit on a flat surface and limiting it from sliding off Connector Protection:

As previously mentioned, there are preferably no protruding connectors that can be damaged during handling or installation as they are all recessed in the niche between the top and bottom plates 108 and 109 thanks to the difference in foot prints of the plates 108 and 109 and the side walls 110 and 112.

In accordance with a preferred embodiment, all connectors are preferably mechanically secured to the chassis in order to transfer the connection stress from the connector to a sturdy part of the converter. As such, the stress is not transmitted to the electronic components, which are thus protected from damage.

Extra Features:

According to a preferred embodiment, no dip switches are needed as the professional video converter preferably starts and runs automatically. The converter will preferably automatically detect the incoming signal format and configure itself accordingly.

Also according to a preferred embodiment, the converter offers several indicators 400, such as those using LED, to give a clear status indication of all critical parameters such as power, signal format and operation. Other types of visual indicators may be used without departing from the scope of the invention.

Still according with a preferred embodiment, a unique coding system using color and alpha characters allows for quick identification of a device type and function on the field even by unqualified personnel.

The unit is preferably compliant to international safety standards such as UL, CSA, FCC, CE or IEC.

While illustrative and presently preferred embodiment(s) of the invention have been described in detail hereinabove, it is to be understood that the inventive concepts may be otherwise variously embodied and employed and that the appended claims are intended to be construed to include such variations except insofar as limited by the prior art.

What is claimed is:

1. A video converter comprising:
   at least one enclosure for protecting electronic components disposed within said at least one enclosure, the electronic components allowing converting at least one input signal each having a first format to at least one output signal each having a second format different from the first format, the at least one enclosure comprising a top and bottom plates and a side wall extending therebetween, each of the top and bottom plates comprising at least one magnet;
   at least one input connector extending from the at least one enclosure, each input connector being adapted for receiving the at least one input signal and transmitting the at least one input signal to the electronic components;
   at least one output connector extending from said at least one enclosure, each output connector being adapted for transmitting the output signal from the electronic components; and
   an internal power supply comprising an AC to DC conversion unit integrated into the at least one enclosure for powering the electronic components, the AC to DC conversion unit being configured to be directly connected to a standard AC circuit.

2. The converter according to claim 1, wherein:
   the top and bottom plates each define a first foot print and the side wall defines a second foot print smaller than the first foot print;
   some of the one or more input and output connectors are disposed in a niche formed by a portion of the first foot print that overlaps the second foot print, the one or more input and output connectors are thus protected within the niche by the top and bottom plates.

3. The converter according to claim 2, wherein the top and bottom plates defines respectively a first and second aperture aligned one to the other and adjacent to the niche, the apertures being configured to accommodate a safety element to strap the converter.

4. The converter according to claim 3, further comprising a stand-off connecting the top and bottom plates at a corner of the one or more input and output connectors adjacent to the niche, the stand-off in collaboration with the niche allowing to attach an anti-theft cable, a safety cable and/or a safety strap.

5. The converter according to claim 2, wherein the at least one magnet is configured for temporarily fixing the converter onto a magnetic surface or to stack the converter to a second converter.

6. The converter according to claim 1, wherein the at least one enclosure forms a squared box or rectangular parallelepiped box allowing setting the converter in different stable positions.

7. The converter according to claim 1, wherein the top and bottom plates are made of a metal and/or a shock resistant material.

8. The converter according to claim 1, wherein the power supply comprises a locking AC conductor equipment AC connector embedded within the side wall.

9. The converter according to claim 1, further comprising an electrical outlet embedded within the at least one enclosure and adapted for powering another device.

10. The converter according to claim 9, wherein the other device is a projector, a TV set, a laptop, a monitor, a mobile device or an audio system and the converter is adapted to convert at least one video and/or at least one audio format to, respectively, any other video and/or audio format.

11. The converter according to claim 1, wherein said one or more input and output connectors are of a lockable type, the side wall of the at least one enclosure comprising a plurality of holes, each hole being configured to lock one of said lockable connectors.

12. The converter according to claim 11, wherein the holes comprise a threaded portion to lock the one or more input and output connectors.

13. The converter according to claim 1, further comprising at least one visual indicator for providing at least one status indication of at least one parameter.

14. The converter according to claim 1, wherein each of the top and bottom plates comprises two spaced apart magnets.

15. The converter according to claim 1, further comprising an electrical outlet embedded within the at least one enclosure and adapted for powering another device.

16. A video converter comprising:
at least one enclosure for protecting electronic components disposed within said at least one enclosure, the electronic components allowing converting at least one input signal each having a first format to at least one output signal each having a second format different from the first format, the at least one enclosure comprising:
a top plate having a surface defining a groove;
a bottom plate having a surface defining a protrusion matching the groove, the matching groove and protrusion allowing maintaining a stability of several video converters when stacked together; and
a side wall extending therebetween;
at least one input connector extending from the at least one enclosure, each input connector being adapted for receiving the at least one input signal and transmitting the at least one input signal to the electronic components;
at least one output connector extending from said at least one enclosure, each output connector being adapted for transmitting the output signal from the electronic components; and
an internal power supply comprising an AC to DC conversion unit integrated into the at least one enclosure for powering the electronic components, the AC to DC conversion unit being configured to be directly connected to a standard AC circuit.

17. The converter according to claim 16, wherein: the top and bottom plates each define a first foot print and the side wall defines a second foot print smaller than the first foot print; some of the one or more input and output connectors are disposed in a niche formed by a portion of the first foot print that overlaps the second foot print, the one or more input and output connectors are thus protected within the niche by the top and bottom plates.

18. The converter according to claim 17, wherein the protrusion is a rubber pad or a foam pad acting as a non-skid cushion firmly securing the converter on a flat surface, limiting as such the converter from sliding off.

19. The converter according to claim 16, wherein the protrusion has a thickness larger than a depth of the groove for avoiding two consecutive stacked converters to rub one to the other.

20. The converter according to claim 16, wherein each of the top and bottom plates comprises at least one magnet for temporarily fixing the converter on a magnified surface or to stack the converter to a second converter.

* * * * *